United States Patent [19]

Norling

[11] Patent Number: 5,367,217

[45] Date of Patent: Nov. 22, 1994

[54] FOUR BAR RESONATING FORCE TRANSDUCER

[75] Inventor: Brian L. Norling, Mill Creek, Wash.

[73] Assignee: AlliedSignal Inc., Morris Township, Morris County, N.J.

[21] Appl. No.: 978,264

[22] Filed: Nov. 18, 1992

[51] Int. Cl.[5] .............................................. H01L 41/08
[52] U.S. Cl. ................................... 310/370; 73/862.59; 310/321
[58] Field of Search .............. 73/862.59, 702, 517 AV, 73/DIG. 1, DIG. 4; 310/367, 370, 366, 368, 321, 330, 331, 25, 306, 309, 316

[56] References Cited

U.S. PATENT DOCUMENTS

| | | | |
|---|---|---|---|
| 3,566,166 | 2/1971 | Borner | 310/321 |
| 4,037,121 | 7/1977 | Nakamura et al. | 310/321 |
| 4,215,570 | 8/1980 | EerNisse | 73/862.59 |
| 4,372,173 | 2/1983 | EerNisse et al. | 73/862.59 |
| 4,415,827 | 11/1983 | Chuang | 310/370 |
| 4,469,979 | 9/1984 | Chuang | 310/370 |
| 4,531,073 | 7/1985 | EerNisse | 310/370 |
| 4,654,663 | 3/1987 | Alsenz et al. | 310/370 X |
| 4,757,228 | 7/1988 | Kalinoski et al. | 310/316 |
| 4,764,244 | 8/1988 | Chitty et al. | 310/367 X |
| 4,785,215 | 11/1988 | Blech | 310/329 |
| 4,901,586 | 2/1990 | Blake et al. | 73/862.59 |
| 4,912,990 | 4/1990 | Norling | 73/862.59 |
| 4,929,860 | 5/1990 | Hulsing et al. | 310/366 |
| 5,020,370 | 6/1991 | Deval | 310/321 X |

Primary Examiner—Mark O. Budd
Attorney, Agent, or Firm—Howard G. Massung

[57] ABSTRACT

A force sensing element is formed with four vibrating beams having substantially the same width and length. The four beams are spaced apart and disposed parallel to one another and are connected at opposite ends by end portions. With such a configuration, the outer beams move in phase with each other but 180° out of phase with the inner beams. As such, the linear and angular reaction forces at the end portions are effectively cancelled. One advantage of such a configuration is its relative insensitivity to manufacturing process variations. By utilizing four beams which are nearly identical in width, variation in fabrication tolerance has virtually an equal effect on beam mass such that the dynamic balance of the force sensing element is maintained to a high degree of accuracy. Various drive methodologies for the force sensing element are disclosed as well as force sensing elements with integrally-formed isolator systems.

64 Claims, 8 Drawing Sheets

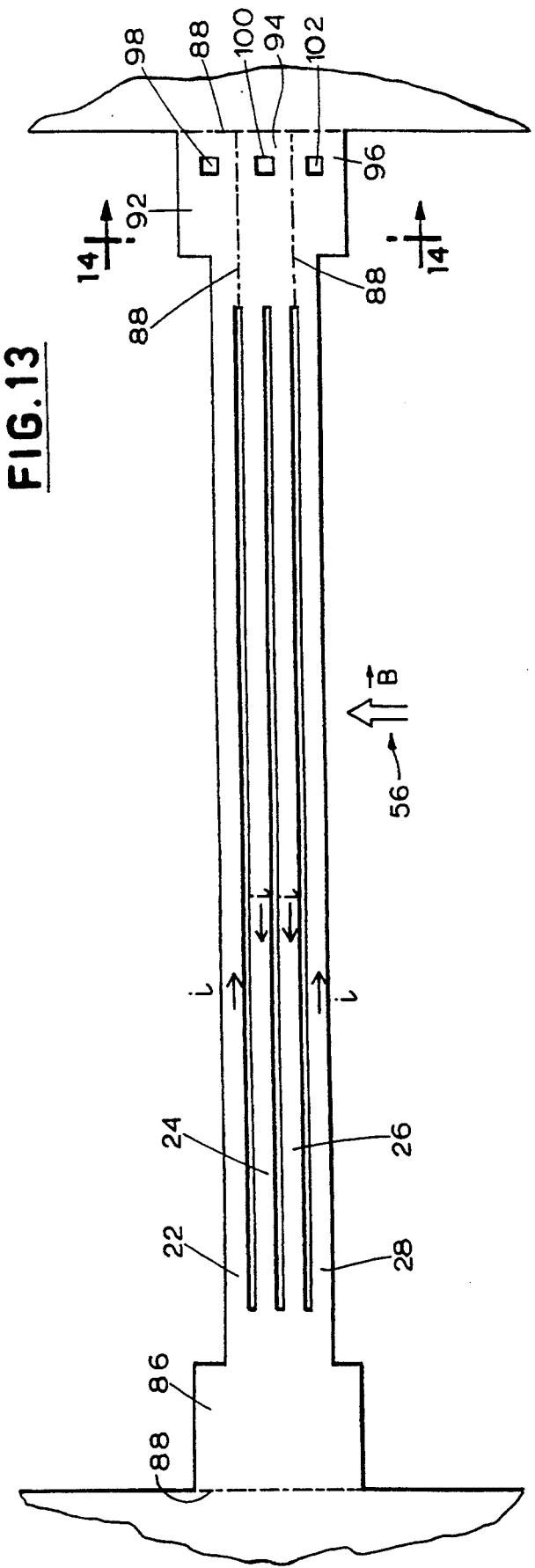

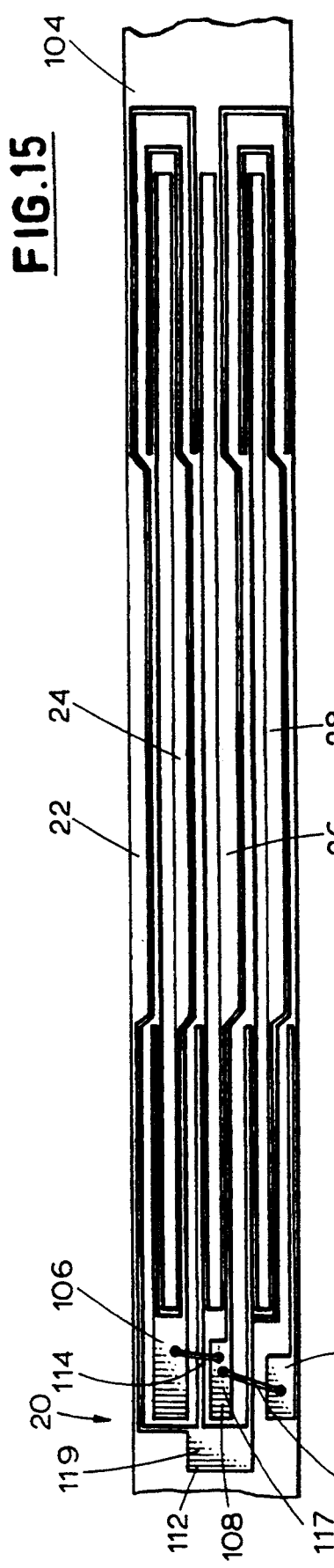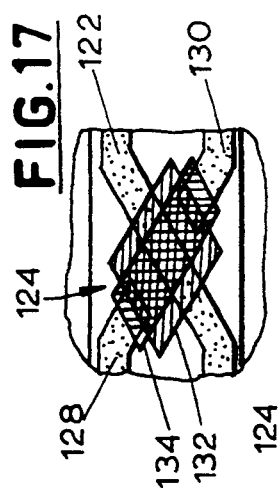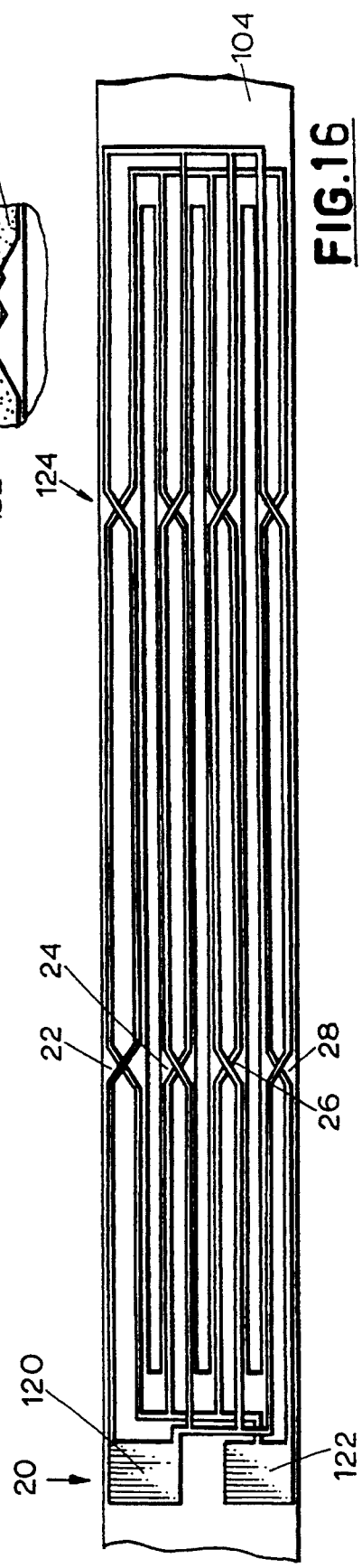

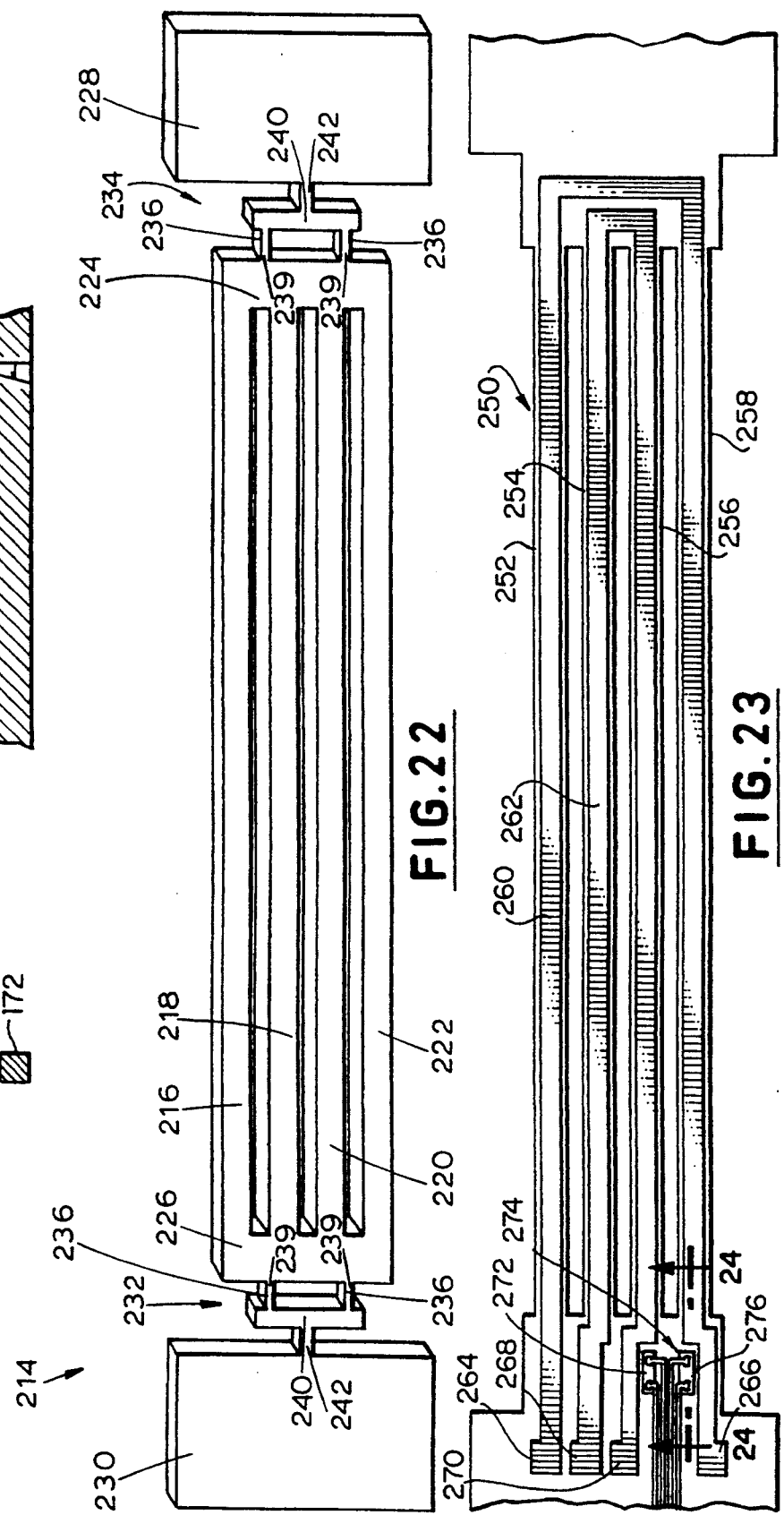

FOUR BAR RESONATING FORCE TRANSDUCER

BACKGROUND OF THE INVENTION

1. Field of the Invention

The present invention relates to a force sensing element and, more particularly, to a vibrating beam type force sensing element used as a resonant element in a crystal-controlled oscillator. The resonant element is designed to minimize the loss of energy due to a phenomenon known as "end pumping" to maintain a relatively high mechanical Q. The resonant element is also designed to be virtually insensitive to manufacturing process variations.

2. Description of the Prior Art

Vibrating beam force sensing elements used as resonators in crystal-controlled oscillators are generally known in the art. Examples of such force sensing elements are disclosed in U.S. Pat. Nos. 4,215,570; 4,372,173; 4,415,827; 4,901,586 and 4,912,990. Such force sensing elements have been known to be used in various transducers to measure various parameters, including acceleration, force, temperature, pressure and weight. In particular, such vibrating beam force sensing elements are responsive to forces, such as axial forces, which cause a variation of the frequency of vibration of the beams which, in turn, causes a variation in the output frequency of the oscillator which, in turn, can be used as a measure of the applied force.

An important consideration in transducers having vibrating beam force sensing elements is the mechanical Q of the element. The mechanical Q is the ratio of the energy stored to the energy lost in the vibrating beams for each cycle of vibration. A force sensing element with a relatively low mechanical Q will result in increased power requirements for the oscillator and can result in relatively unstable oscillations. The frequency of oscillation is also more sensitive to changes in the oscillator electronics and ambient conditions in low Q systems. For these reasons, it is desirable to optimize the mechanical Q of the force sensing element.

However, the mechanical Q of such force sensing elements tends to be sensitive to manufacturing process variations as well as other factors, including a phenomenon known as end pumping. End pumping relates to a condition in which a portion of the energy in the vibrating beams is transferred to the transducer mounting structure (e.g., ground connection) and is thereby lost. More particularly, such vibrating beam force sensing elements include generally parallel, spaced-apart beams connected together at opposite ends to form end portions. The force sensing element is then disposed within a transducer with one end portion rigidly secured to a stationary ground connection or mounting structure and the other end portion is rigidly secured to a movable structure, such as a proof mass. End pumping causes the transfer of energy from the vibrating beams to the mounting structure in the transducer housing.

The end pumping phenomenon is best understood with reference to a single beam force sensing element as illustrated in FIG. 1. In particular, vibration of the beam results in a moment at the end portion due to reaction forces counteracting the turn around acceleration of the beam element. This results in finite motion at the ground connection that causes energy to be transferred from the resonant beam into the ground connection. As a result, the mechanical Q of the force sensing element is reduced. Additionally, if the ground connection is reactive in its response to the transferred energy, it can interact with the resonance and cause localized non-linearities in the force-to-frequency function, commonly called "activity dips". Such activity dips typically occur when the coupled resonance in the mounting frame structure falls within the operating frequency range of the vibrating beam force sensing element. In order to solve this problem with single beam force sensing elements, elaborate schemes have been developed to provide active dynamic counterbalancing mechanical isolators. However, even though such mechanical isolators have been found to be effective, they substantially add to the size, cost, complexity and axial compliance of the force sensing element; all of which are undesirable.

Two-beam force sensing elements as illustrated in FIG. 2 have also been utilized to reduce reaction forces to ground through the process of cancellation; however, even though the reaction forces to ground cancel in the two-beam force sensing elements, there are other problems. More specifically, in such force sensing elements, the end portions are used to couple the vibrating beams such that they vibrate in sympathetic motion at the same frequency, but 180° out of phase with respect to each other. Even though such two-beam force sensing elements do not require mechanical isolators to achieve relatively high mechanical Q's, the vibrating beams must be closely coupled in order for the two-beam system to resonate at a single frequency. This requires the force sensing element to be formed such that the beams are relatively close together. However, this can lower the mechanical Q of the force sensing element when it is operated in a gas. More particularly, in such a situation, the gas is pumped into and out of the gap between the vibrating beams forming a squeeze film gas damper which effectively lowers the mechanical Q.

In order to solve the various problems associated with the above-mentioned force sensing elements, a three-beam force sensing element as illustrated in FIG. 3 evolved to cancel reaction forces to ground. In a three-beam force sensing element, the outer beams move out of plane and in phase with each other, but 180° out of phase with the center beam. In order to provide dynamic balance, the center beam must have approximately twice the mass of the outer beams. A principal advantage of the three-beam force sensing element is that the gas damping between the tines is driven only by a shearing motion which generates an order of magnitude less damping than the compressive-expansive squeeze film damping produced by the two-beam force sensing element discussed above. However, there are various disadvantages of a three-beam force sensing element, including the added complexity of the center beam; the bending strength profile in the end portions, which is more difficult to localize and isolate; and the difficulty in creating precisely mass balanced beams. The mass balancing problem is further aggravated by the different widths of the beams. In particular, when the beams are fabricated, variations in the processing can affect the width of the beams. Because the center beam is approximately twice the width of the outer beams, a processing variation which affects the width of the beams will have twice the effect on mass variations on the outer beams as it has on the center beams. As such, mass balancing is extremely process sensitive.

SUMMARY

It is an object of the present invention to overcome many of the problems associated with vibrating beam force sensing elements.

It is another object of the invention to provide a force sensing element that is virtually insensitive to manufacturing process variations.

It is another object of the present invention to provide a force sensing element that has a relatively high mechanical Q.

It is a further object of the present invention to provide a force sensing element that minimizes the reaction forces to ground.

Briefly, the present invention relates to a force sensing element formed with four vibrating beams having generally the same width and length. The four beams are spaced apart and disposed parallel to one another and are connected at opposite ends by end portions. With such a configuration, the outer means move in phase with each other, but 180° out of phase with the inner beams. Thus, the linear and angular reaction forces at the end portions are effectively cancelled. One advantage of such a configuration is its relative insensitivity to manufacturing process variations. By utilizing four beams having nearly identical widths, variations in fabrication tolerance have virtually the same effect on the mass of each beam so that the dynamic balance of the force sensing element is maintained to a relatively high degree of accuracy.

BRIEF DESCRIPTION OF THE DRAWING

These and other objects and advantages of the present invention will become readily apparent upon consideration of the following detailed description and attached drawing, wherein:

FIG. 13 is a plan view of an alternative embodiment of a magnetically driven force sensing element utilizing the conductivity of the resonator material to provide the drive electrodes;

FIG. 14 is a partial sectional view taken along line 14—14 of FIG. 13;

FIG. 15 shows an embodiment of an electrode pattern for a crystalline quartz force sensing element in accordance with the present invention that utilizes wire bonded jumpers;

FIG. 16 is an alternative embodiment of the electrode pattern illustrated in FIG. 15 using thin film insulation crossovers.

FIG. 17 is an enlarged view of an encircled crossover portion of the force sensing element illustrated in FIG. 16;

FIG. 20 is a cross-sectional view taken along line 20—20 of FIG. 19;

FIG. 22 is similar to FIG. 18, illustrating another alternative isolator system;

FIG. 23 is a plan view of the four beam resonator according to the invention utilizing thermal excitation; and FIG. 24 is a partial cross-sectional view of the resonator of FIG. 23 taken along lone 24—24 thereof.

DETAILED DESCRIPTION OF THE PREFERRED EMBODIMENT

Figure 1:
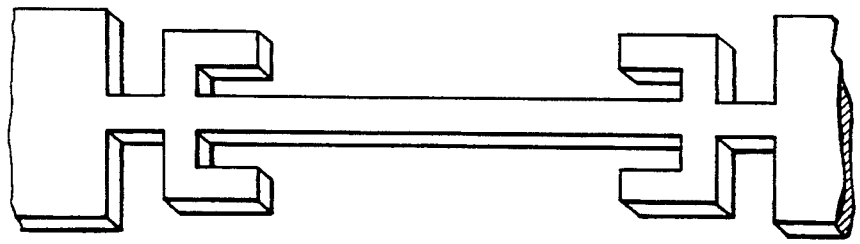
FIG. 1 is a perspective view of a known single beam force sensing element.
Figure 2:
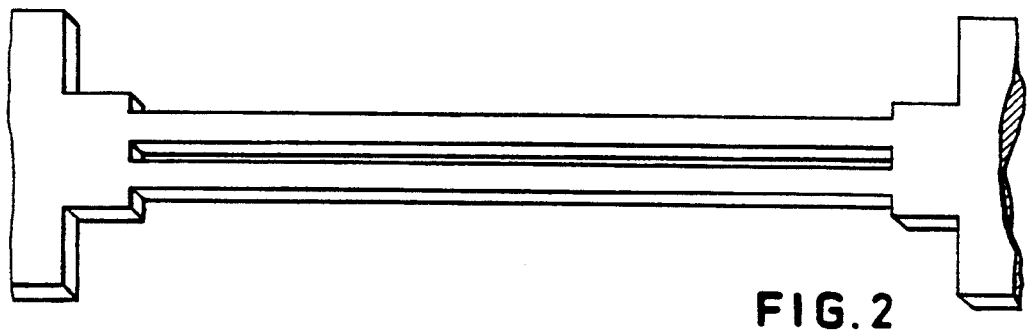
FIG. 2 is a perspective view of a known two-beam force sensing element.
Figure 3:
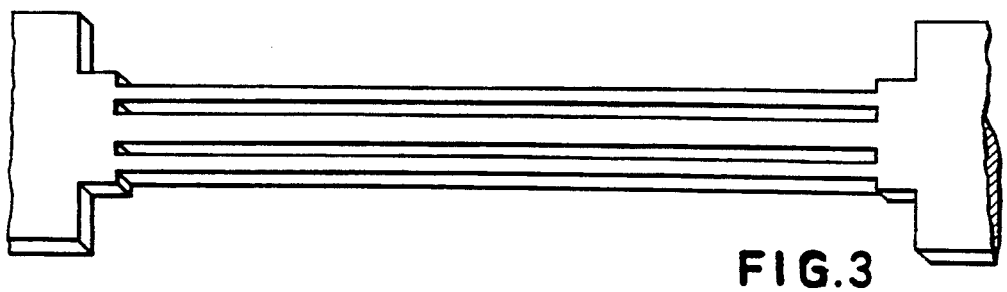
FIG. 3 is a perspective view of a known three-beam force sensing element.
Figure 4:
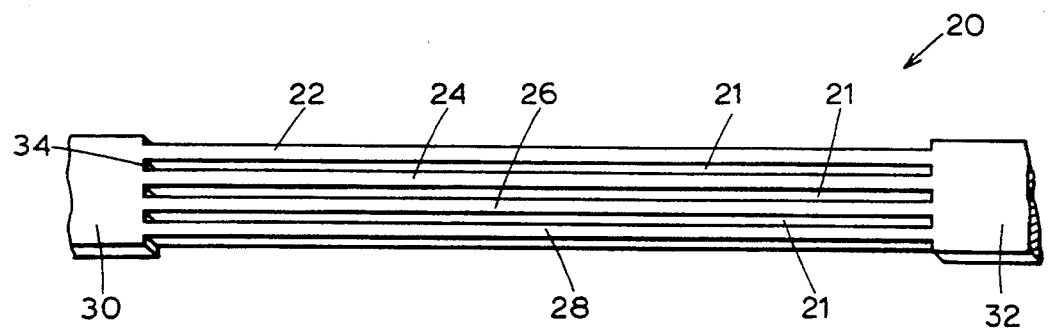
FIG. 4 is a perspective view of a four-beam force sensing element in accordance with the present invention shown in an unexcited or static state.
Figure 5:
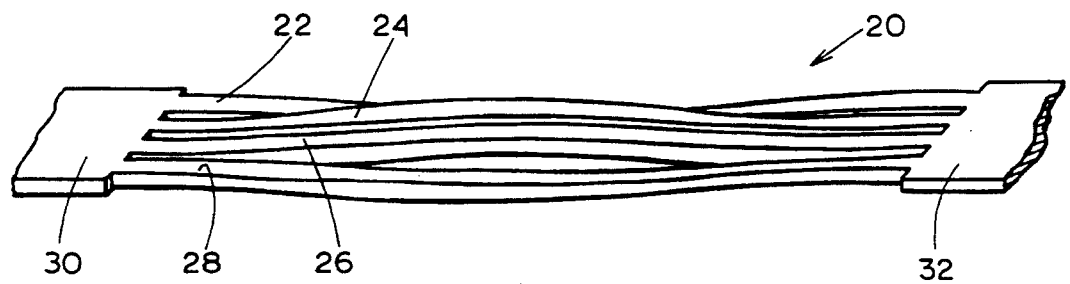
FIG. 5 is a perspective view of the four-beam force sensing element illustrated in FIG. 4 shown in an excited state.

The present invention relates to a force sensing element, generally designated by the reference numeral 20. An important aspect of the invention is that the force sensing element 20 can be relatively consistently manufactured with a relatively high mechanical Q. The consistency derives from the configuration that makes the force sensing element 20 relatively insensitive to manufacturing process variations. One embodiment of the force sensing element 20 in accordance with the present invention is illustrated in FIGS. 4 and 5. In this embodiment, the force sensing element 20 is formed from a planar sheet of material as discussed below with three elongated slots 21 that form four parallel and spaced-apart beams or tines 22, 24, 26 and 28. The beams 22, 24, 26 and 28 are formed with substantially equal widths and substantially equal lengths and are joined together at opposite ends by integrally-formed end portions 30 and 32, defining crotch portions 34 between adjacent beams 22, 24, 26 and 28 at each end.

FIG. 4 illustrates the force sensing element 20 in its stationary or non-excited state while FIG. 5 illustrates the force sensing element in an excited state, showing exaggerated motion. As shown in FIG. 5, in response to an excitation signal, the outer beams 22 and 28 moves out of plane in phase with each other, but 180° out of phase with the inner beams 24 and 26. As a result, there is a net cancellation of the linear and angular reaction forces at the end portions 30 and 32 that minimizes the effects of end pumping as discussed above. Consequently, the mechanical Q of the force sensing element is relatively high.

The force sensing element 20 in accordance with the present invention may be fabricated from various substrate materials, including crystalline quartz and crystalline or polycrystalline silicon, silicon dioxide, silicon nitride and other materials. In an embodiment. utilizing crystalline quartz, the force sensing element 20 is formed as a unitary element made by cutting a generally rectangular and flat planar sheet or web of crystalline material having substantially uniform thickness. The crystalline quartz may be cut by a known fabrication process, such as photolithographic masking with anisotropic, wet chemical etching which yields relatively high accuracy to form the four-beam force sensing element 20. In embodiments utilizing single crystal silicon or polysilicon, the force sensing element 20 is formed from a planar sheet of silicon and preferably cut by photo-lithographic masking with reactive ion etching.

Figure 18:
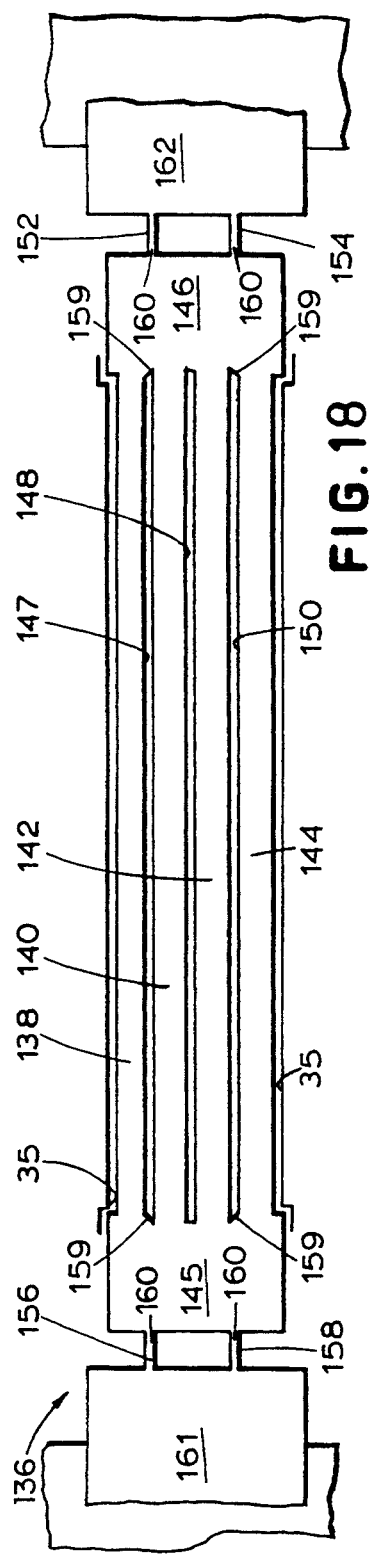
FIG. 18 is an alternative embodiment of the force sensing element in accordance with the present invention incorporating an isolator system.

As best shown in FIG. 18, it is preferable that the beams be equal in width and that the spacing between the beams 22, 24, 26 and 28 be substantially equal to the spacing between the outer beams 22 and 28 and a disposable portion 35 of the substrate. More particularly, the outer beams 22 and 28 are formed to be slightly offset from the elongated sides of the substrate resulting in the disposable portion 35. Forming the spacings between the beams 22, 24, 26 and 28 such that they are generally equal to the spacing from the disposable portion 35, helps to ensure uniformity of the beam width despite process variability.

An important aspect of the four-beam force sensing element 20 relates to its relative insensitivity to manufacturing process variations. In particular, whether etched, ultrasonically milled, water jet cut or formed by another material removal technique, the overcut or undercut from the desired dimension is typically uniform on all cut surfaces. Thus, by utilizing four beams, generally identical in width, the variation in fabrication tolerance has an equal effect on beam mass so that the dynamic balance of the force sensing element is maintained to a relatively high degree of accuracy.

Figure 6:
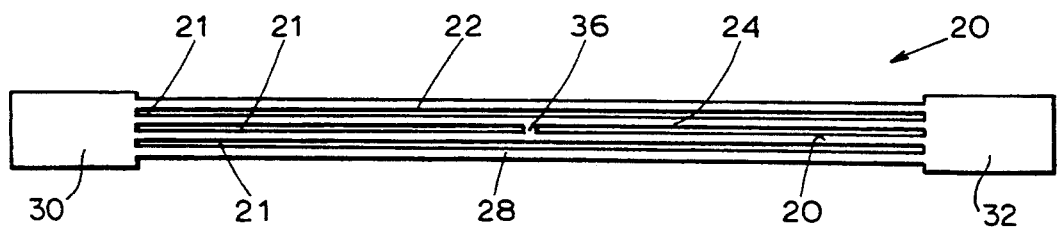
FIG. 6 is a plan view of an alternative embodiment of the force sensing element illustrated in FIGS. 4 and 5 illustrating a bridge member connecting the inner beams.

In an alternative embodiment of the invention illustrated in FIG. 6, the two inner beams 24 and 26 are synchronized to prevent undesirable modes of operation (e.g., the two inner beams 24 and 26 moving out of phase). More particularly, the force sensing element 20 is formed as generally discussed above in connection with FIG. 4; however, in order to synchronize the two inner beams 24 and 26, an interconnecting bridge member 36 connects the two inner beams 24 and 26. As shown in FIG. 6, the bridge member 36 is disposed generally perpendicularly to the inner beams 24 and 26 and approximately at the center thereof. However, it is also contemplated that multiple bridge members 36 may be disposed at various locations along the length of the beams 24 and 26 to suppress various undesirable modes of operation.

There are several advantages to using the bridge member 36 to synchronize the inner beams 24 and 26 to suppress undesirable modes of operation. Firstly, the bridge member 36 has virtually no effect on the desired resonant mode except for adding a relatively small amount of mass. Secondly, the bridge member 36 has virtually no effect on the edge setback sensitivity because the bridge member 36 forms a relatively small fraction of the total beam length.

Figure 7:
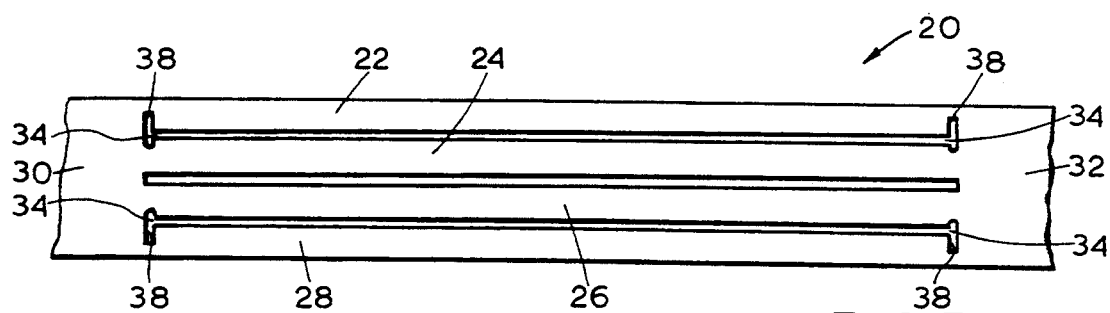
FIG. 7 is a partial plan view of another alternative embodiment of a force sensing element in accordance with the present invention.

An alternative embodiment of the invention is illustrated in FIG. 7. In this embodiment of the invention, compensation is provided for the bending of the end portions 30 and 32 that can cause rotation of the beams 22, 24, 26 and 28 as a result of the finite compliance of the end portions 30 and 32 and the forces applied thereto. In particular, the center of mass and center of elastic support of the beams are misaligned to compensate for the bending of the end portions 30 and 32. The compensation is accomplished by providing various cuts or reduced mass portions 38 in the force sensing element 20. Thus, for a four-beam force sensing element 20, four cuts are provided. These cuts are generally disposed in the crotch portions 34 of the outer beams 22 and 28 substantially perpendicularly to the beams 22 and 28 forming a T-shape as shown. The cuts 38 offset the center of mass in order to allow the motion of the individual beams 22, 24, 26 and 28 to be substantially perpendicular to the plane of the force sensing element, thus minimizing torque in the beams during resonant motion.

A consideration in the design of a force sensing element is the maximization of its usable measurement range. A key factor in this regard is the thickness-to-width ratio of the beams. It is known that when this ratio becomes relatively large, the beams can buckle in-plane prior to reaching the desired frequency shift in compression. For example, if a $\Delta f/f_o$ of 10% is desired (where $f_o$ is the no-load frequency and $\Delta f$ equals the frequency shift under load) the Euler buckling load for in-plane buckling must be at least 1/5 of the out-of-plane buckling load. If the ratio is too large, the coupling is poor because the thin, flat wafer becomes excessively compliant. A ratio near unity, but not quite equal to one, has been preferred. The frequency scale factor as a function of load is also very sensitive to the thickness-to-width ratio. This is because additional width does not affect the nominal resonant frequency. However, the load required to obtain the same change in nominal frequency varies linearly with width.

The length-to-thickness ratio becomes the dominant factor controlling stress levels at a given percentage change in nominal frequency. This is apparent at extremely high length-to-thickness ratios where long, slender columns buckle (e.g., Euler buckling) before significant load can be carried and hence experience only low stress levels.

The thickness-to-width-to-length ratios must also be considered so that no two internal resonances cross in frequency over the usable frequency and temperature range. A crossover would result in a relatively large activity dip that can cause localized non-linearities or even cause the vibration of the resonator to stop. Another consideration is that the resonances move at different frequency scale factors due to geometrical factors. Additionally, if a non-sinusoidal drive wave is used to maintain resonance, higher harmonics of the crystal resonance may also be excited. In this case, crossover of the harmonics of the drive frequency should be limited or, at a minimum, the electrode design should be designed so that they are decoupled from the higher resonant modes.

DRIVE METHODOLOGY

Electrostatic Excitation

Figure 8:
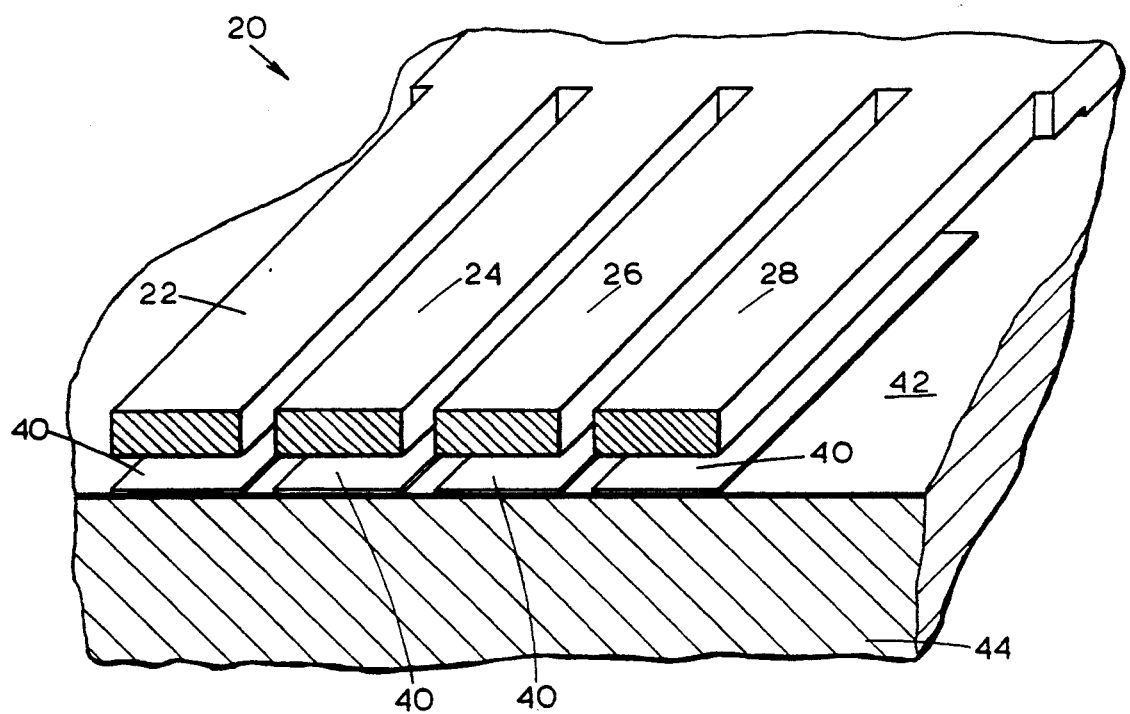
FIG. 8 is a partial perspective view of a force sensing element illustrating an electrostatic drive electrode pattern in accordance with the present invention.

As discussed above, the force sensing element 20 may be formed from crystalline quartz, single crystal or polycrystalline, silicon dioxide, silicon nitride or other materials. Non-piezoelectric elements, such as silicon force sensing elements, can be excited either electrostatically, electromagnetically or thermally. An electrostatic excitation system is illustrated in FIG. 8. In this embodiment, a plurality of thin film electrodes 40 are deposited on an insulating layer 42 of the substrate 44. In this embodiment, the electrodes 40 are formed as generally rectangular members disposed on the substrate 44 adjacent the area where the beams 22, 24, 26 and 28 are to be formed. After the thin film electrodes 40 are deposited on the insulating layer 42, a sacrificial layer (not shown) is formed over the electrodes 40. After the sacrificial layer is deposited over the thin film electrodes 40, the material for the force sensing element, such as doped conductive polysilicon, is deposited in a pattern forming the beams 22, 24, 26 and 28. Subsequently, the sacrificial layer is chemically stripped from under the beams 24, 26 and 28 to free them.

The electrodes 40 are used to excite the force sensing element 20. In particular, an electrical signal is applied to the electrodes 40 to excite the force sensing element 20 and, in particular, the beams 22, 24, 26 and 28. The drive force is a substantially linear function of the width of the beams 22, 24, 26 and 28; disregarding any fringing fields. The motional stiffness of the beams 22, 24, 26 and 28 is a linear function of the beam width and a cubic function of the beam thickness. Accordingly, the thickness, length and electrode spacing are important considerations in the design of a force sensing element 20. Electrostatic excitation is described in greater detail in the aforementioned U.S. Pat. No. 4,901,586 incorporated herein by reference.

Piezoelectric Excitation

Figure 9:
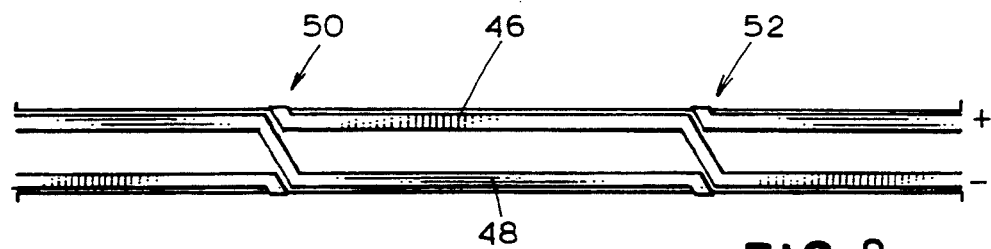
FIG. 9 is a plan view of a piezoelectric drive electrode pattern for one beam of a force sensing element in accordance with the present invention.
Figure 10:
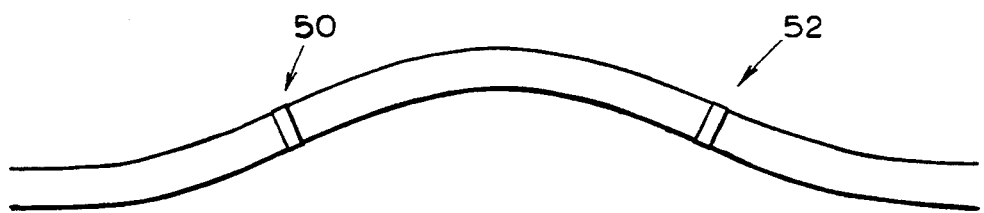
FIG. 10 is an elevational view of the structure illustrated in FIG. 9 with exaggerated motion depicted.

The embodiment of the invention shown in FIGS. 9 and 10 illustrates a crystalline quartz force sensing element. Force sensing elements formed with crystalline quartz are excited according to the piezoelectric properties of the quartz. FIGS. 9 and 10 illustrate a drive electrode pattern for use with Z-cut quartz. In these embodiments, an electrode pattern for a single beam is illustrated; however, it will be understood that the electrode pattern illustrated in FIGS. 9 and 10 is utilized for all four beams 22, 24, 26 and 28. In FIG. 9, two interleaved conductive traces 46 and 48 are illustrated. These conductive traces 46 and 48 are adapted to be connected to a source of excitation energy. The crossover points, identified with the reference numerals 50 and 52, are selected to coincide at the points where the sign of the moment changes.

Another important consideration for the excitation system for the force sensing element is the complexity of the process required to form the electrodes. Because the conductive traces are often formed by photolithography, it is desirable that the traces be applied in a single plane to avoid relatively complex and expensive processing.

In accordance with an important aspect of the invention, a single plane electrode pattern for a Z-cut force sensing element which requires only single-plane photolithography is illustrated in FIG. 15. Such a single plane electrode pattern takes advantage of the fact that the motion of the beams 22, 24, 26 and 28 is perpendicular to the plane of the substrate 104. This allows a potentially lower cost electrode system to be used. More particularly, since the motion of the beams is perpendicular to the plane of the substrate 104, it makes virtually no difference if the drive force is at the top, bottom or center of the beam as long as the center of force is roughly aligned with the elastic center and center of gravity of the beam.

The electrode pattern in accordance with the present invention consists of four irregularly-shaped traces 106, 108, 110 and 112, formed in the configuration illustrated in FIG. 15. In this embodiment, the conductive traces 106, 108 and 110 are connected together by wire jumpers 114 and 116. In particular, the traces 106, 108 and 110 are formed with wire bonding pads 117 which enable the traces 106, 108 and 110 to be connected together by the wire jumpers 114 and 116 and to be connected to a first instantaneous polarity voltage (e.g., negative) by an electrical conductor 118. Similarly, the conductive trace 112 is also formed with a wire bonding pad 119 to enable it to be connected to the opposite instantaneous polarity voltage (e.g., positive) by an electrical conductor 120. In this embodiment, the conductive traces connected to the positive and negative polarities are disposed adjacent each of the beams 22, 24, 26 and 28.

A jumperless embodiment of the electrode pattern is illustrated in FIG. 16. However, in this embodiment, two additional process steps are required. In this embodiment, two irregularly-shaped conductive traces 120 and 122 are provided as shown. Unlike the electrode pattern illustrated in FIG. 15, the electrode pattern illustrated in FIG. 16 allows the traces 120 and 122 to cross over at various locations identified with the reference numeral 124 utilizing insulating layers 126 to separate the traces as illustrated in detail in FIG. 17. More particularly, the conductive traces 120 and 122 are applied in the same plane. However, at each crossover point 124, the conductive trace 122 runs continuously through the crossover point 124. The other conductive trace 120 has a discontinuity to the crossover point 124. In particular, the conductive trace 120 is formed as discontinuous conductor portions 128 and 130 disposed generally perpendicularly to the conductive trace 120. The ends of the portions 128 and 130 are spaced apart a predetermined distance from the conductor 126. An insulating layer 132, such as sputtered silicon dioxide is deposited over the continuous conductive trace 122. Subsequently, a conductor trace 134 is deposited over the portions 128 and 130 to form a continuous electrical path across the junction.

Magnetic Excitation

As discussed and illustrated above, electrostatic excitation is commonly used to excite force sensing elements fabricated from silicon, while force sensing elements fabricated from crystalline quartz are typically driven piezoelectrically. In addition, magnetic and thermal drive systems can also be used as discussed below.

Figure 11:
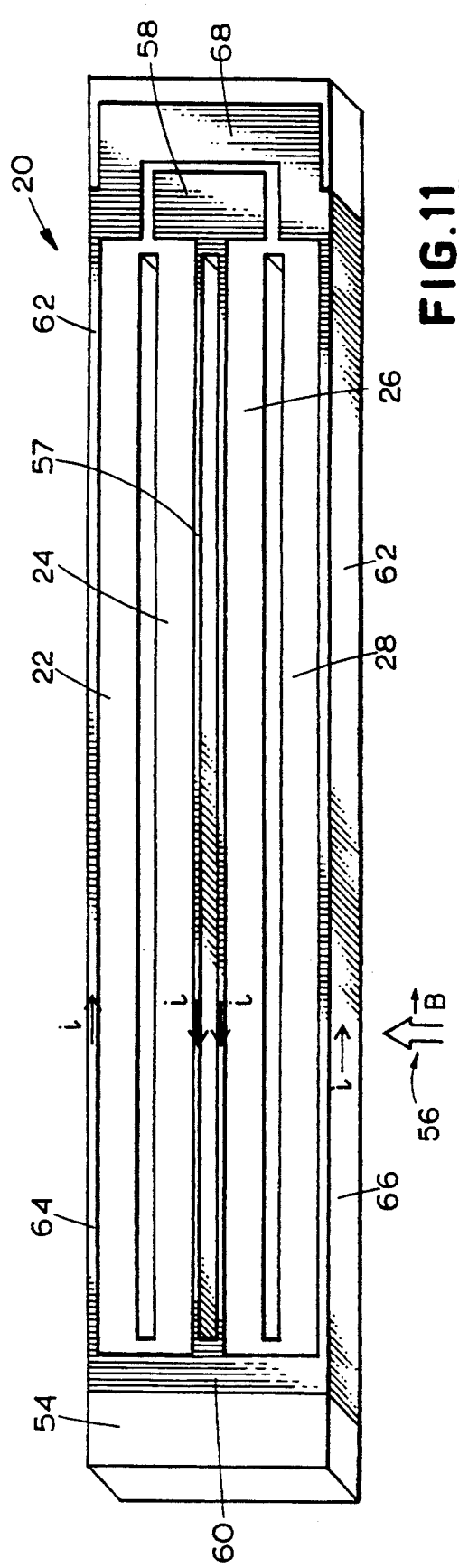
FIG. 11 is a perspective view of a magnetically excited force sensing element illustrating a side trace electrode pattern in accordance with the present invention.
Figure 12:
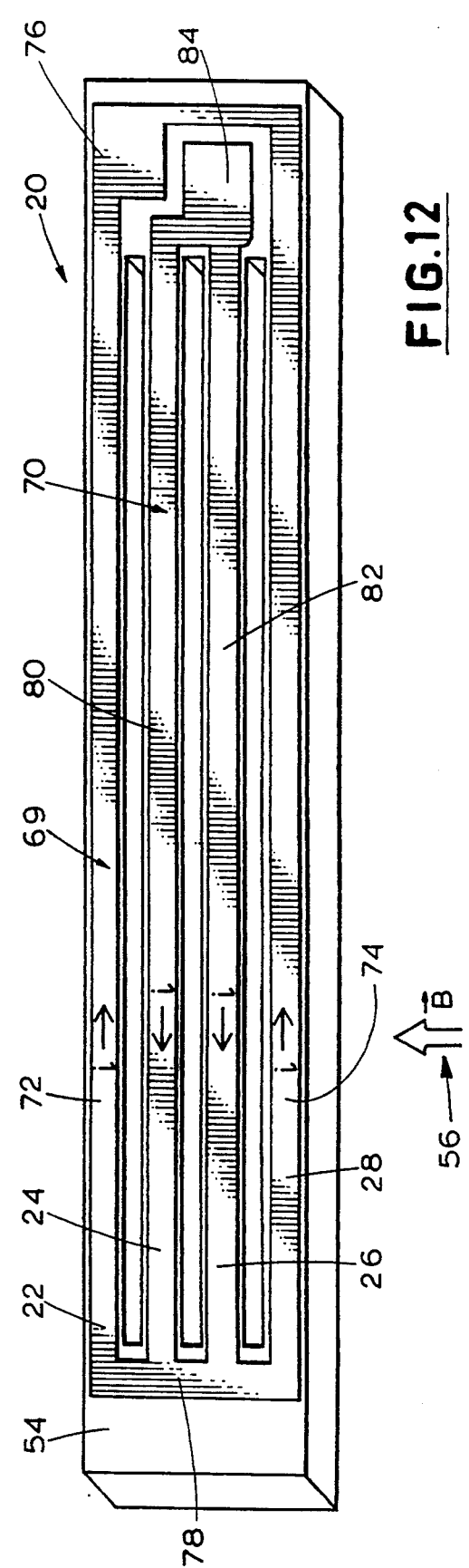
FIG. 12 is an alternative embodiment of the force sensing element of FIG. 11 illustrating a surface trace electrode pattern.

FIGS. 11 and 12 illustrate a magnetically excited force sensing element 20 in accordance with the present invention. If thin film conductors on the surface are used for magnetic excitation, the bulk material utilized for the substrate of force sensing element 20 must be either non-conductive or well insulated. In such an embodiment, conductive traces are disposed on the surface of the substrate 54 in order to allow electrical current to pass therethrough in a direction that is generally parallel to the longitudinal axes of the beams 22, 24, 26 and 28. An externally generated magnetic field represented by the arrow 56 is applied in a direction generally perpendicular to the beams 22, 24, 26 and 28 and the direction of electric current flow. The magnetic field must also be perpendicular to the desired direction of the force vector to be applied to the beams, thus making it parallel to the plane of the resonator in the embodiments of FIGS. 11 and 12. The magnetic field 56 reacts with the magnetic fields produced by the currents flowing in the conductive traces and excites the beams 22, 24, 26 and 28 such that the inner beams 24 and 26 move in one direction out of the plane of the substrate 54 while the outer beams 22 and 28 move 180° out of phase with the inner beams. Magnetic excitation is described in greater detail in the aforementioned U.S. Pat. No. 4,912,990, incorporated herein by reference.

Two embodiments of the electrode patterns for a magnetically excited force sensing element are illustrated in FIGS. 11 and 12. In FIG. 11, a first conductive trace 57 is disposed along opposing edges of the substrate 54 in an area between the inner beams 24 and 26. One end of the conductive trace 57 forms a wire bonding pad 58. The other end of the conductive trace 57 merges into a common portion 60. A second conductive trace 62 is formed with two generally spaced-apart and parallel legs 64 and 66. These legs 64 and 66 are primarily formed along the edges of the substrate 54 and are disposed adjacent the outer beams 22 and 28. The legs 64 and 66 are connected to a wire bonding pad 68 at one end. The other ends of the legs 64 and 66 are connected to the common portion 60. In this embodiment, an electrical current flows in one direction in the conductive trace 57 and in the opposite direction in the legs 64 and 66 of the conductive trace 62. The electrical current flow may be established by attaching an excitation voltage source such as an oscillator between wire bonding pads 58 and 68. Applying the magnetic field 56 in a plane generally perpendicular to the direction of electrical current flow and parallel to the plane of the resonator substrate as shown in FIG. 11 will cause the inner beams 24 and 26 to move out of plane in phase with each other and in synchronism with the excitation voltage, while the outer beams 22 and 28 will move in phase with each other, but 180° out of phase with the inner beams 24 and 26. This embodiment causes the center of force to be misaligned with the center of elastic restoring force of the beam; however, the misalignment is acceptable in a high Q resonator where only a small amount of drive energy is imparted during each cycle relative to the amount of energy stored in the resonator.

An alternative embodiment of a magnetically excited force sensing element is illustrated in FIG. 12. In this embodiment, two conductive traces 69 and 70 are disposed on the surface of the substrate 54. The conductive trace 69 is formed with two parallel, spaced-apart legs 72 and 74 that are disposed on the outer beams 22 and 28. The legs 72 and 74 are connected together at one end forming a wire bonding pad 76. The opposite ends of the legs 72 and 74 are connected together to form a common section 78. The conductive trace 70 is formed with two parallel, spaced-apart leg portions 80 and 82. The leg portions 80 and 82 are connected at one end a wire bonding pad 84, and the opposite ends of the legs 80 and 82 are connected to the common portion 78.

In the embodiment of FIG. 12, an electric current flows in one direction in the leg portions 80 and 82 of the conductive trace 70 in the opposite direction in the legs 72 and 74 of the conductive trace 69. In order to initiate current flow in the legs 72, 74, 80 and 82 as shown, an excitation voltage is applied between the wire bonding pads 84 and 76 in a manner as described in conjunction with FIG. 11. By applying a magnetic field 56 in a plane generally orthogonal to the direction of electrical current flow, the inner beams 24 and 26 will be excited to move out of plane in plane with each other relative to the substrate 54. The outer beams 22 and 28 will also move out of plane relative to the substrate 54, but 180° out of phase with the inner beams 24 and 26.

In another alternative embodiment illustrated in FIGS. 13 and 14, a magnetically driven force sensing element is formed from a conductive substrate 86, such as silicon. In the embodiment of FIGS. 13 and 14, relatively narrow slits represented by dashed tines 88 are cut into the substrate 86 in the positions indicated in FIG. 14. The slits 88 are then filled with a non-conductive structural material 90, such as silicon dioxide or silicon nitride as illustrated in FIG. 14. In this embodiment, the conductive substrate 86 itself is used as the electrodes. More particularly, as illustrated in FIG. 13, three conductive regions 92, 94 and 96 are electrically insulated from each other at one end of the substrate 86 by the nonconductive filler 90. Wire bonding pads 98, 100 and 102 are disposed on each of the conductive portions 92, 94 and 96. Applying an excitation voltage between the common pad 100 and each of the pads 98 and 102, causes an electric current to flow through the beams so that the direction of the current in the inner beams 24 and 26 is the same, and the direction of the current in the outer beams 22 and 28 is also the same but 180° out of phase with the current in the inner beams 24 and 26. The magnetic fields generated by the currents flowing through the beams will interact with the magnetic field 56 and cause the inner beams 24 and 26 to move out of the plane of the substrate 86 in phase with each with other, and the outer beams 22 and 28 to move out of plane together 180° out of phase with the inner beams 24 and 26.

Thermal Excitation

An excitation system that is useful for non-piezoelectric devices such as silicon, particularly for small devices having a low thermal mass, is a thermal excitation system. In thermal excitation, opposite sides of a tine are alternately heated, preferably by resistive heating, so as to cause opposite sides of the tine to alternately expand to thereby induce the tines to vibrate. An example of a thermally excited resonator is illustrated in FIG. 23. FIG. 23 shows a four-bar resonator 250, preferably made of crystalline silicon although polysilicon, silicon dioxide, silicon nitride and other materials can be used. The resonator 250 has four bars or tines 252, 254, 256 and 258. On the upper surfaces of the tines are two resistive heating traces 260 and 262. The resistive heating trace 260 overlies the tines 252 and 258 and terminates in a pair of bonding pads 264 and 266. The resistive trace 262 overlies the tines 254 and 256 and terminates in a pair of bonding pads 268 and 270. Traces similar to the resistive heating traces 260 and 262 are disposed on the bottom side of the resonator 250 (not shown) and work in conjunction with the traces 260 and 262 to excite the tines into vibration.

For example, in order to cause the outer tines 252 and 258 to vibrate, electrical power is alternately applied to the resistive trace 260 and a similar trace on the bottom sides of the tines 252 and 258. This may be accomplished by utilizing a pulse generator that alternately applies a pulse between the bonding pads 264 and 266 and similar bonding pads on the opposite side of the resonator 250. Alternatively, an oscillator having a rectifier in its output circuit may be used so that half cycles of one polarity are applied to the bonding pads 264 and 266 and half cycles of the opposite polarity are applied to bonding pads on the opposite side of the resonator 250 so that the trace 260 and the similar trace on the bottom side of the resonator 250 are alternately energized at the vibratory frequency.

When a half cycle of oscillator voltage or a pulse from the pulse generator is applied across the bonding pads 264 and 266, a current will flow through the trace 260. The current will cause the trace 260 to heat up and to heat the upper surfaces of the tines 252 and 258 thereby causing the upper surfaces to expand. The expansion will cause the tines 252 and 258 to bow upwardly. During the next half cycle, the current flow through the trace 260 will be terminated thereby permitting the trace 260 and the upper surfaces of the tines 252 and 258 to cool. Simultaneously, a current will be caused to flow through the resistive trace on the lower surfaces of the tines 252 and 258 thereby heating the lower surfaces of the tines 252 and 258. The heating of the lower side combined with the cooling of the upper sides of the tines 252 and 258 will cause the tines 252 and 258 to bow downwardly. Continuing to heat the upper and lower sides of the tines in an alternating relationship will excite the tines into vibratory motion. The trace 262 on the tines 254 and 256 and another trace similar to the trace 262 on the bottom sides of the tines 254 and 256 are also alternately energized to induce vibratory motion in the tines 254 and 256; however, the traces on the tines 254 and 256 are energized 180° out of phase with the traces on the tines 252 and 258 to cause the tines 254 and 256 to vibrate 180° out of phase with the tines 252 and 258.

Because a resonator such as the resonator 250 is generally utilized in a feedback loop of an oscillator so that the resonant frequency of the resonator determines the frequency of the oscillator, it is necessary to obtain a feedback signal representative of the position or velocity of the tines from the resonator to control the oscillation frequency of the oscillator. Such a feedback signal is readily obtained in a piezoelectric device from the same electrodes that are used to drive the device (or from separate sensing electrodes) because movement of the tines will cause a piezoelectrically-generated voltage to appear across the electrodes. Similarly, in a magnetically-driven devices, the feedback signal can be obtained from the conductive traces used to drive the resonator or from separate sensing conductive traces) because a voltage will be induced in the conductive traces as the tines vibrate with respect to the external magnetic field. However, in a thermally-excited system, there is no piezoelectrically-generated or magnetically-induced feedback voltage that appears across the resistive traces and a separate sensor must be used to provide the feedback signal. Such a feedback signal is provided by a pair of sensors 272 and 274 disposed adjacent the tines 256 and 258. While a separate sensor may be disposed adjacent each of the four tines, only two sensors are necessary because the inner tines and the outer tines vibrate in phase with each other.

The sensor 274 is shown in greater detail in FIG. 24. FIG. 24 shows a cross-section of the substrate of the resonator 250 and shows a highly doped region 276 within the substrate. A pair of conductors 278 and 280 are disposed at opposite ends of the highly doped region 276 to permit an electrical connection to be made thereto. The highly doped region 276 and the conductors 278 and 280 form a piezoresistive sensor or strain gauge that senses the strain caused by the vibration of a tine as illustrated by the strain profile 282. Thus, as the tine vibrates, the highly doped area 276 is alternately stretched and compressed, thereby alternately increasing and decreasing the resistance between the conductive areas 278 and 280. By sensing the change in resistance that occurs in synchronism with the vibration of the tine, a feedback signal can be provided to the oscillator to control its frequency of oscillation.

ISOLATOR SYSTEM

One potential problem with a four bar force sensing element 20, as illustrated in FIGS. 4 and 5, is that the dynamic reaction forces tend to bend the end portions 30 and 32. More particularly, as best illustrated in FIG. 5, the outer beams 22 and 28 move in a direction opposite to the inner beams 24 and 26, which results in bowing of the end portions 30 and 32. Such bowing of the end portions 30 and 32 can result in energy transfer to the ground connection resulting in an energy loss and, thus, a lower mechanical Q of the system. The bowing can also cause the force sensing element to be sensitive to mounting conditions and geometry.

FIGS. 18–22 illustrate various configurations of an integral isolator system for reducing the energy loss resulting from the bowing of the end portions. Referring first to FIG. 18, a force sensing element 136 is illustrated, formed with four parallel, spaced-apart beams 138, 140, 142 and 144. These beams are connected together at each end by end portions 145 and 146. The beams 138, 140, 142 and 144 are formed by cutting spaced-apart elongated slots 147, 148 and 150 into a substrate as previously discussed.

The isolator system includes torsion bars 152, 154, 156 and 158 disposed at the nodal points 160 of the bending movement of the end portions 145 and 146. Two torsion bars 152 and 154, 156 and 158 interconnect each of the end portions 145 and 146 with an integrally-formed mounting pad portions 161 and 162. The torsion bars 152, 154, 156 and 158 experience no out-of-plane motion and are subjected to only relatively small counter-rotating torques. Because of the relatively low rotational stiffness of the torsion bars 152, 154, 156 and 158, the strain in the end portions 145 and 146 is attenuated to a relatively low torque transmitted to the mounting pad portions 161 and 162. The torque applied to the torsion bars 152 and 154 and to the torsion bars 156 and 158 is equal and opposite in magnitude sign. Therefore, the torque applied to the end pads 161 and 162 cancel and little or no torque is transmitted to ground. The inner beams 140 and 142 may be made slightly longer than the outer beams 138 and 144 by beveling the ends 159 of the slots 146 and 150 as shown. By extending the length of the inner beams 140 and 142, the resonant frequency of the inner beams 140 and 142 can be tuned to resonate at the same frequency as the outer beams 138 and 144 without transferring out-of-plane forces to the end pads 161 and 62.

Figure 19:
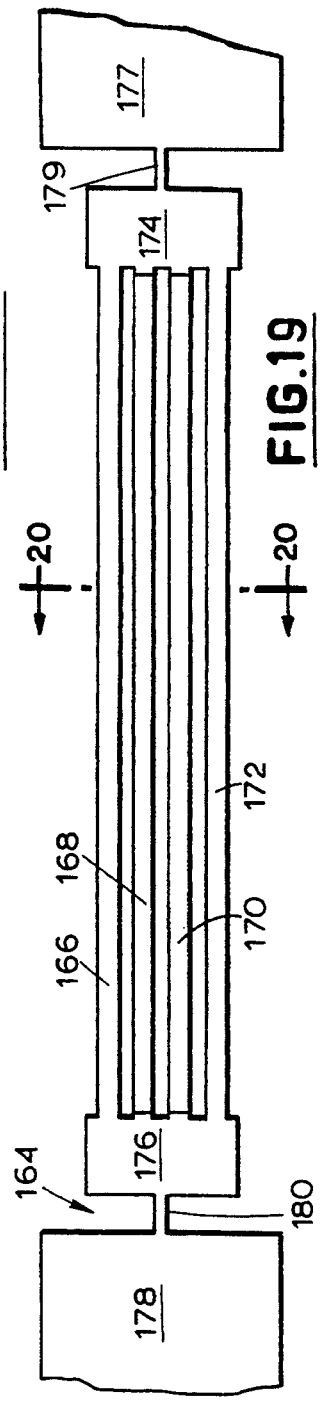
FIG. 19 is similar to FIG. 18, illustrating an alternative isolator system.

An alternative embodiment of a force sensing element with an integral isolation system is illustrated in FIGS. 19 and 20, and generally identified with the reference numeral 164. In this embodiment, a force sensing element 164 includes four parallel, spaced-apart beams 166, 168, 170 and 172 connected at opposite ends to end portions 174 and 176. The end portions 174 and 176 are connected to integrally-formed mounting pads 177 and 178 by centrally disposed torsion bars 179 and 180 at each end of the resonator. Because the torsion bars 179 and 180 are not connected at nodal points, the torsion bars 179 and 180 will experience a relatively small amount of out-of-plane motion as the end portions 174 and 176 bend; however, the central location of the torsion bars 179 and 180 minimizes any torque transmitted to the ground connection. The central location of the torsion bars 179 and 180 also provides in-plane rejection of mounting torques which could de-tune the vibrating beams 166, 168, 170 and 172. The inner beams 168 and 170 can be tuned to resonate at the same frequency as the outer beams 166 and 172 to minimize reaction forces to ground. The tuning is accomplished by making the inner beams 168 and 170 thinner than the outer beams 166 and 172 as illustrated in FIG. 20.

Figure 21:
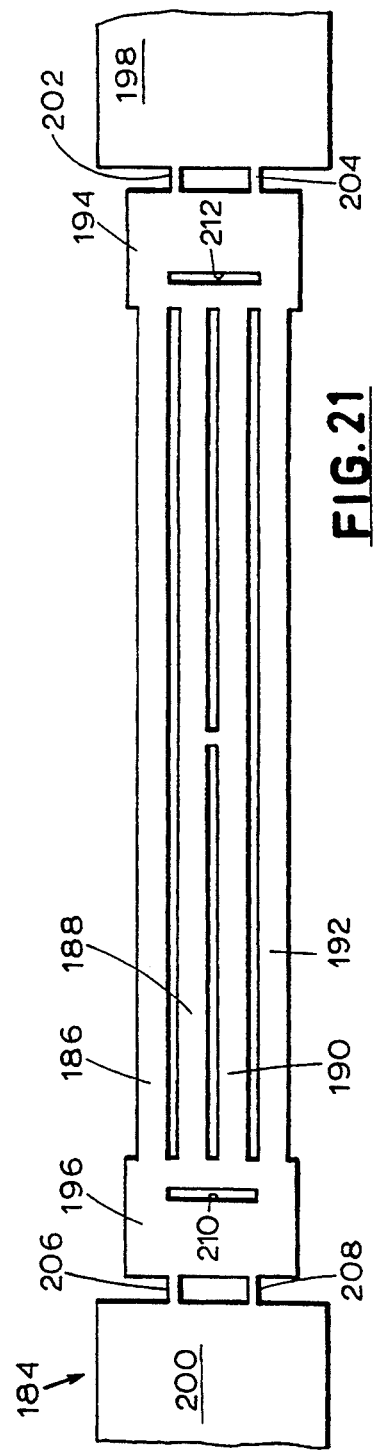
FIG. 21 is similar to FIG. 18, illustrating another alternative isolator system.

FIG. 21 illustrates another embodiment of a force sensing element with an integral isolator system, generally designated by the reference numeral 184. The force sensing element 184 includes four parallel, spaced-apart beams 186, 188, 190 and 192 connected at each end by end portions 194 and 196. The end portions 194 and 196 are connected to mounting pad portions 198 and 200 by two torsion bars 202, 204 and 206, 208 at each end. The torsion bars 202, 204, 206 and 208 provide isolation similar to that of the embodiment illustrated in FIG. 18. However, the isolation is provided by two cuts 210 and 212 formed in each of the respective end portions 194 and 196. The cuts 210 and 212 allow the beams 186, 188, 190 and 192 to be cut to the same length to reduce sensitivity to manufacturing tolerances. The cuts 210 and 212 cause the center beams 188 and 190 to have the same out-of-plane stiffness as the outer beams 186 and 192.

Another alternative embodiment of a force sensing element with an integral isolation system is illustrated in FIG. 22 and generally identified with the reference numeral 214. In this embodiment, the force sensing element 214 includes four parallel, spaced-apart beams 216, 218, 220 and 222 connected at opposite ends by end portions 224 and 226. The end portions 224 and 226 are connected to mounting pads 228 and 230 integrally-formed goal post-shaped isolators 232 and 234. The isolators 232 and 234 each include a pair of torsion bars 236 connected to the end portions 224 and 226 at the nodal points 239. The torsion bars 236 and 238 are connected to a substantially horizontal isolator beam 240 which is substantially stiffer than the torsion bars 236 and 238 to minimize bending moments to ground. The beam 240 is connected to the mounting pads 228 and 230 by a centered isolator beam 242 that is generally parallel to the torsion bars 236 and 238. The isolator beam 242 is centrally disposed relative to the beam 240 and provides two functions. Firstly, the centered isolator beam 242 virtually prevents bending moments from being applied to the mounting pads 228 and 230 as a result of motion of the beams 216, 218, 220 and 222. Secondly, the centered isolator beam 242 isolates the force sensing element from in-plane rotation of the mounting pads 228 and 230 to minimize any de-tuning of the resonant frequency of one beam relative to the others.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A resonant element adapted to be secured to a mounting structure in a force sensing transducer, said resonant element comprising:

a generally planar substrate having three elongated slots formed therein defining four generally parallel, spaced-apart beams including a pair of inner beams and a pair of outer beams, said inner pair of beams and said outer pair of beams all joined together at opposite ends by integrally-formed end portions; and means for coupling said beams to an excitation source, said coupling means being responsive to the excitation source for causing said outer beams to vibrate generally in phase and out of plane relative to said substrate while said inner beams vibrate out of plane and generally in phase with each other, but out of phase with said outer beams.

2. A resonant element as recited in claim 1, wherein said beams are fabricated from crystalline quartz.

3. A resonant element as recited in claim 1, wherein said predetermined material that includes silicon.

4. A resonant element as recited in claim 1, further including means including a bridge interconnecting said inner beams for synchronizing the vibration of said inner beams.

5. A resonant element adapted to be secured to a mounting structure in a force sensing transducer, said resonant element comprising:

a generally planar substrate having three elongated slots formed therein defining four generally parallel, spaced-apart beams including a pair of inner beams and a pair of outer beams each joined at opposite ends by integrally-formed end portions:

means for coupling said beams to an excitation source, said coupling means being responsive to the excitation source for causing said outer beams to vibrate generally in phase and out of plane relative to said substrate while said inner beams vibrate out of plane and generally in phase with each other, but out of phase with said outer beams; and means including a bridge interconnecting said inner beams for synchronizing the vibration of said inner beams, wherein said bridge interconnecting said inner beams is generally centrally located along the lengths of said inner beams.

6. A resonant element as recited in claim 5, wherein said bridge is disposed generally perpendicularly to said inner beams.

7. A resonant element as recited in claim 4, wherein said bridge is integrally formed with said inner beams.

8. A resonant element adapted to be secured to a mounting structure in a force sensing transducer, said resonant element comprising:

a generally planar substrate having three elongated slots formed therein defining four generally parallel, spaced apart beams including a pair of inner beams and a pair of outer beams each joined at opposite ends by integrally formed end portions;

means for coupling said beams to an excitation source, said coupling means being responsive to the excitation source for causing said outer beams to vibrate generally in phase and out of plane relative to said substrate while said inner beams vibrate out of plane and generally in phase with each other, but out of phase with said outer beams; and means for reducing the bending of said end portions caused by the vibration of said beams.

9. A resonant element as recited in claim 8, wherein said reducing means includes a plurality of cuts disposed at opposite ends of said outer beams.

10. A resonant element as recited in claim 9, wherein said cuts are disposed generally perpendicularly to said outer beams.

11. A resonant element as recited in claim 1, wherein said coupling means includes electrostatic coupling means.

12. A resonant element as recited in claim 1, wherein said coupling means includes electromagnetic coupling means.

13. A resonant element as recited in claim 1, wherein said coupling means includes thermal coupling means.

14. A resonant element as recited in claim 1, wherein said inner and outer beams are generally equal in width.

15. A resonant element as recited in claim 1, further including means for isolating said beams from said mounting structure to minimize energy transfer to said mounting structure.

16. A resonant element as recited in claim 1, further including means for sensing the position of said beams.

17. A resonant element as recited in claim 1, wherein said coupling means includes electrodes formed in a single plane.

18. A resonant element as recited in claim 17, wherein said electrodes overlap.

19. A resonant element as recited in claim 1, wherein said substrate material is formed in part from an electrically conductive material.

20. A resonant element as recited in claim 1, wherein said coupling means includes a plurality of electrodes disposed on said beams for piezoelectrically exciting said beams.

21. A resonant element as recited in claim 20, wherein said electrodes partially overlap at predetermined crossover points.

22. A resonant element as recited in claim 21, wherein said crossover points are selected to coincide with the points along the beam where the sign of the moment changes.

23. A resonant element as recited in claim 1, wherein said substrate has an edge and a predetermined thickness and is formed from a non-conductive material, and wherein said coupling means includes a plurality of conductive traces formed on said beams wherein at least a portion of the conductive traces is disposed along a portion of said edge of said substrate.

24. A resonant element as recited in claim 23, wherein a portion of said conductive traces is disposed on the edge of the substrate between adjacent beams.

25. A resonant element adapted to be secured to a mounting structure in a force sensing transducer, said resonant element comprising:
a generally planar substrate having three elongated slots formed therein defining four generally parallel, spaced apart beams including a pair of inner beams and a pair of outer beams each joined at opposite ends by integrally formed end portions;
means for coupling said beams to an excitation source, said coupling means being responsive to the excitation source for causing said outer beams to vibrate generally in phase and out of plane relative to said substrate while said inner beams vibrate out of plane and generally in phase with each other, but out of phase with said outer beams, wherein said substrate has an edge and a predetermined thickness and is formed from a non-conductive material, and wherein said coupling means includes a plurality of conductive traces formed on said beams wherein at least a portion of the conductive traces is disposed along a portion of said edge of said substrate; and
means for generating a magnetic field in a direction generally perpendicular to the beams.

26. A resonant element as recited in claim 25, wherein said conductive traces are configured such that the direction of electrical current in the conductive traces disposed on the inner beams is opposite to the direction of electrical current flow in the conductive traces disposed on the outer beams.

27. A resonant element as recited in claim 26, wherein the direction of electrical current flow in the conductive traces is generally perpendicular to the direction of the magnetic field.

28. A resonant element adapted to be secured to amounting structure in a force sensing transducer, said resonant element comprising:
a generally planar substrate having three elongated slots formed therein defining four generally parallel, spaced apart beams including a pair of inner beams and a pair of outer beams each joined at opposite ends by integrally formed end portions; and
means for coupling said beams to an excitation source, said coupling means being responsive to the excitation source for causing said outer beams to vibrate generally in phase and out of plane relative to said substrate while said inner beams vibrate out of plane and generally in phase with each other, but out of phase with said outer beams, wherein said coupling means includes means for exciting said beams including a plurality of conductive traces adapted to be connected to a source of electrical energy and means for applying a magnetic field in a direction generally perpendicular to said beams.

29. A resonant element as recited in claim 28, wherein said plurality of conductive traces are formed in a single plane.

30. A resonant element as recited in claim 29, wherein said plurality of conductive traces are disposed on said beams.

31. A resonant element as recited in claim 30, wherein said conductive traces are configured so that the direction of electric current flow in the conductive traces disposed on the outer beams is in a direction opposite to the direction of electrical current flow in the conductive traces disposed on the inner beams.

32. A resonant element as recited in claim 29, wherein said conductive traces are configured so that the direction of electric current flow in said traces is generally perpendicular to the direction of the magnetic field.

33. A force sensing element for use in a transducer, said force sensing element comprising:
a piezoelectric substrate formed with a plurality of generally parallel, spaced-apart beams connected at opposite ends to form end portions;
a plurality of first conductive traces forming an electrode pattern disposed on each of said plurality of beams;
a plurality of second conductive traces forming an electrode pattern disposed on each of said plurality of beams, wherein said second conductive traces cross over said first conductive traces at predetermined crossover points; and means for insulating said first conductive traces from said second conductive traces at said crossover points.

34. A force sensing element as recited in claim 33, wherein said second conductive traces are formed with discontinuous portions at said crossover points.

35. A force sensing element as recited in claim 34, wherein said insulating means includes an insulating layer disposed over said first conductive traces at said crossover points and wherein a conductive material is disposed on top of said insulating layer and connected to said discontinuous portions of said second conductive traces to form a continuous electrical current path at said crossover points relative to said second conductive traces.

36. A force sensing element for use in a transducer, said force sensing element comprising:

a piezoelectric substrate formed with a plurality of generally parallel, spaced apart beams connected at opposite ends to form end portions;

a plurality of first conductive traces forming an electrode pattern disposed on each of said plurality of beams;

a plurality of second conductive traces forming an electrode pattern disposed on each of said plurality of beams, wherein said second conductive traces crossover said first conductive traces at predetermined crossover points; and means for insulating said first conductive traces from said second conductive traces at said crossover points, wherein said first conductive traces and said second conductive traces are formed on a single plane.

37. A force sensing element for use in a transducer, said force sensing element comprising:

a substrate having four generally parallel and spaced-apart beams formed thereon, including a pair of inner beams and a pair of outer beams connected at opposite ends thereof to a common portion;

mounting pads, coupled to said end portions at each end; and means for isolating said mounting pad portions from forces in said end portions.

38. A force sensing element as recited in claim 37, wherein said mounting pads and said isolating means are integrally formed.

39. A force sensing element as recited in claim 36, wherein the mass of the inner beams is different than the mass of the outer beams.

40. A force sensing element as recited in claim 39, wherein said inner beams are slightly longer than said outer beams.

41. A force sensing element as recited in claim 39, wherein said beams have different cross-sectional areas.

42. A force sensing element as recited in claim 41, wherein said inner beams have a relatively smaller cross-sectional area than said outer beams.

43. A force sensing element as recited in claim 38, wherein said isolating means includes a torsion bar interposed between one of said end portions and one of said mounting pads.

44. A force sensing element as recited in claim 38, wherein said isolating means includes two torsion bars interposed between one of said end portions and one of said mounting pads.

45. A force sensing element as recited in claim 44, wherein said torsion bars are disposed at bending moment nodal points of the end portion.

46. A force sensing element as recited in claim 45, wherein said inner beams are slightly longer than said outer beams.

47. A force sensing element as recited in claim 45, further including means for causing said inner beams to have substantially the same out-of-plane stiffness as said outer beams.

48. A force sensing element as recited in claim 47, wherein said causing means includes an elongated cut formed in each of said end portions.

49. A force sensing element as recited in claim 45, wherein said inner beams are the same length as said outer beams.

50. A force sensing element as recited in claim 49, further including means for causing said inner beams to have substantially the same out-of-plane stiffness as said outer beams.

51. A force sensing element as recited in claim 37, wherein said isolating means includes a pair of torsion bars connected between each end portion at the nodal points and a first isolator beam disposed generally perpendicularly to said beams, said isolator beam being connected to said mounting pad portions by a second isolator beam generally parallel to said torsion bars to form a goalpost-like structure.

52. A force sensing element as recited in claim 51, wherein said first isolator beam is stiffer than said torsion bars.

53. A force sensing element as recited in claim 51, wherein said second isolator beam is centrally disposed with respect to said mounting pad portions.

54. A vibrating tine resonator for use as a transducer or the like, said resonator comprising:

a unitary body cut from flat, planar stock and having a generally uniform thickness;

said body including spaced apart end portions; and said body including a tine system extending between said end portions;

said vibrating tine resonator being characterized by:

said tine system including a pair of similar tine arrays separated by a slot and extending side-by-side between said end portions;

each array including a pair of tines extending parallel to one another; and a bridge portion spanning said slot and joining adjacent tines of said two arrays.

55. A vibrating tine resonator as claimed in claim 54, each said bridge portion being located at the mid-points of said tines.

56. A vibrating tine resonator as claimed in claim 54, wherein there are only two of said tine arrays.

57. A vibrating tine resonator as claimed in claim 54, wherein said arrays are coupled to one another only by connections of said tines to said body at the ends of said tines.

58. A vibrating tine resonator as claimed in claim 54, further comprising means for exciting said tines to vibrate in a resonant out-of-plane mode.

59. A vibrating tine resonator as claimed in claim 58, wherein said exciting means comprises electrodes coupled to said tines.

60. A vibrating tine resonator as claimed in claim 59, wherein said electrodes include metallized areas on the surfaces of said tines.

61. A vibrating tine resonator as claimed in claim 60, wherein said electrodes are located substantially only on the major surfaces of said tines.

62. A vibrating tine resonator as claimed in claim 61, wherein said electrodes comprise a pair of electrodes disposed in a parallel relationship on each of the major surfaces of said tines.

63. A vibrating tine resonator as claimed in claim 62, wherein said electrodes cross over each other along the length of said tines.

64. A vibrating tine resonator as claimed in claim 62, wherein said electrodes wind around said tines.

* * * * *